United States Patent

Hibino

[11] Patent Number: 5,977,475
[45] Date of Patent: Nov. 2, 1999

[54] CONVERGING SOLAR MODULE

[75] Inventor: Kouetsu Hibino, Nisshin, Japan

[73] Assignee: Toyota Jidosha Kabushiki Kaisha, Japan

[21] Appl. No.: 08/948,658

[22] Filed: Oct. 10, 1997

[30] Foreign Application Priority Data

Oct. 11, 1996 [JP] Japan ................................ 8-269994

[51] Int. Cl.$^6$ ................................................. H01L 31/052
[52] U.S. Cl. ...................... 136/246; 136/259; 126/600; 126/601; 126/605; 126/698; 126/699; 126/572; 126/574; 126/576; 250/203.4
[58] Field of Search ................................. 136/246, 259; 126/600, 601, 605, 698, 699, 572, 574, 576; 250/203.4

[56] References Cited

U.S. PATENT DOCUMENTS

| | | | |
|---|---|---|---|
| 4,147,561 | 4/1979 | Knight | 136/259 |
| 4,786,795 | 11/1988 | Kurashima et al. | 136/246 |
| 5,600,124 | 2/1997 | Berger | 136/246 |
| 5,632,823 | 5/1997 | Sharan | 136/246 |
| 5,707,458 | 1/1998 | Nagashima et al. | 136/259 |

FOREIGN PATENT DOCUMENTS 55-60152  5/1980  Japan .
62-5315   1/1987  Japan .

Primary Examiner—Alan Diamond
Attorney, Agent, or Firm—Finnegan, Henderson, Farabow, Garrett & Dunner, L.L.P.

[57] ABSTRACT

There is provided a converging solar module of a simple structure which can accurately track the sun and efficiently generate electricity. A converging solar module comprises an electricity generating converging lens (10) made of resin having a flat shape, and a solar battery cell (12) placed in the vicinity of a focal area of the converging lens (10). The converging lens (10) and the solar cell (12) are rotatable as a unit. The electricity generating converging lens (10) is attached to a shaft (20) of a rotation driving motor (18). Using sunlight converged by a cylindrical position detecting converging lens (40), a position detecting sensor (42) locates the sun, and outputs information regarding the position of the sun as angle information to a controller (48). The controller (48) in turn outputs a control signal to the rotating driving motor (18), which then drives the electricity generating converging lens (10) and the solar battery cell (12), whereby they are moved while rotating as a unit in accordance with the detected position f the sun. With this arrangement, the electricity generating converging lens (10) is brought into a position where it is continuously directed vertically to incoming sunlight.

5 Claims, 7 Drawing Sheets

CONVERGING SOLAR MODULE

BACKGROUND OF THE INVENTION

1. Field of the Invention

The present invention relates to an improvement to a converging solar module, and in particular to a converging solar module capable of performing efficient electricity generation by converging, while tracking, sunlight.

2. Description of the Prior Art

Conventionally, solar cells have been utilized for a variety of purposes. In order to reduce costs for electricity generation systems using solar cells, various converging solar modules have been proposed, including one in which area of an expensive solar cell battery is reduced through incoming converging sunlight via a lens. In addition, various systems for tracking the sun have also been proposed to further enhance efficiency in electricity generation by a converging solar module. Japanese Utility Model Laid-open Publication No. Sho 62-5315 discloses such a converging solar module, in which, as shown in FIGS. 7a and 7b of the instant specification, the whole set of a converging lens 50, a solar cell 12, and a cell holder frame 30 is moved so as to direct the sun according to the direction in which sunlight 44 incomes into the lens 50, to thereby track the sunlight 44. With this arrangement, having been converged via the converging lens 50, sunlight 44 always irradiates the solar cell 12 so that favorable electricity generation is achieved.

In this conventional converging solar module, however, a large and complicated device is necessary to move the heavy and large converging lens 50 and other equipment. Such a large device consumes a large amount of energy for driving the tracking device, and a corresponding amount of electricity is deducted from the electricity generated by the module. Therefore, generation efficiency of the system as a whole deteriorates.

Even worse, an expensive device is necessary to achieve accurate tracking of the sun in order to cope with difficulties which generally accompany such tracking. This inevitably increases the cost of such devices.

SUMMARY OF THE INVENTION

The present invention has been conceived to overcome the above problems and aims to provide a converging solar module of a simple structure capable of accurate tracking of the sun and highly efficient electricity generation.

In order to achieve the above object, the present invention provides (claim 1)

a converging solar module for generating electricity while tracking and converging sunlight comprising:

a position detecting converging lens having a cylindrical shape;

a position detecting sensor arranged in the vicinity of a focal area of the position detecting converging lens on a circumferential surface thereof;

an electricity generating converging lens made of resin having a flat shape;

a solar cell arranged in the vicinity of a focal area of the electricity generating converging lens; and a driver driving to rotate the electricity generating converging lens and the solar battery cell as one unit in response to a signal from the position detecting sensor thereby directing the electricity generating converging lens to the sun.

According to another aspect of the invention, (claim 2) in the solar module as defined as above, the electricity generating converging lens is a Fresnel lens having a linear focal area.

According to yet another aspect of the invention, (claim 3) in the solar module as defined as above, the solar cell is constructed to have a linear shape so as to match to the linear focal area of the electricity generating converging lens, and is capable of moving horizontally along the linear focal area.

According to still another aspect of the invention, (claim 4)

in the solar module as defined as above, the electricity generating converging lenses and the solar cells are respectively divided into a plurality of units, which are provided in a rotation axial direction of the driver.

According to further another aspect of the invention, (claim 5)

in the solar module as defined as above, the electricity generating converging lens has functions of a spherical lens.

BRIEF DESCRIPTION OF THE DRAWINGS

The above and other objects, features, and advantages, will become further apparent from the following description of the preferred embodiment taken in conjunction with the accompanying drawings wherein.

DESCRIPTION OF THE PREFERRED EMBODIMENTS

In the following, preferred embodiments of the present invention will be described according to the accompanying drawings.

Embodiment 1.

Figure 1:
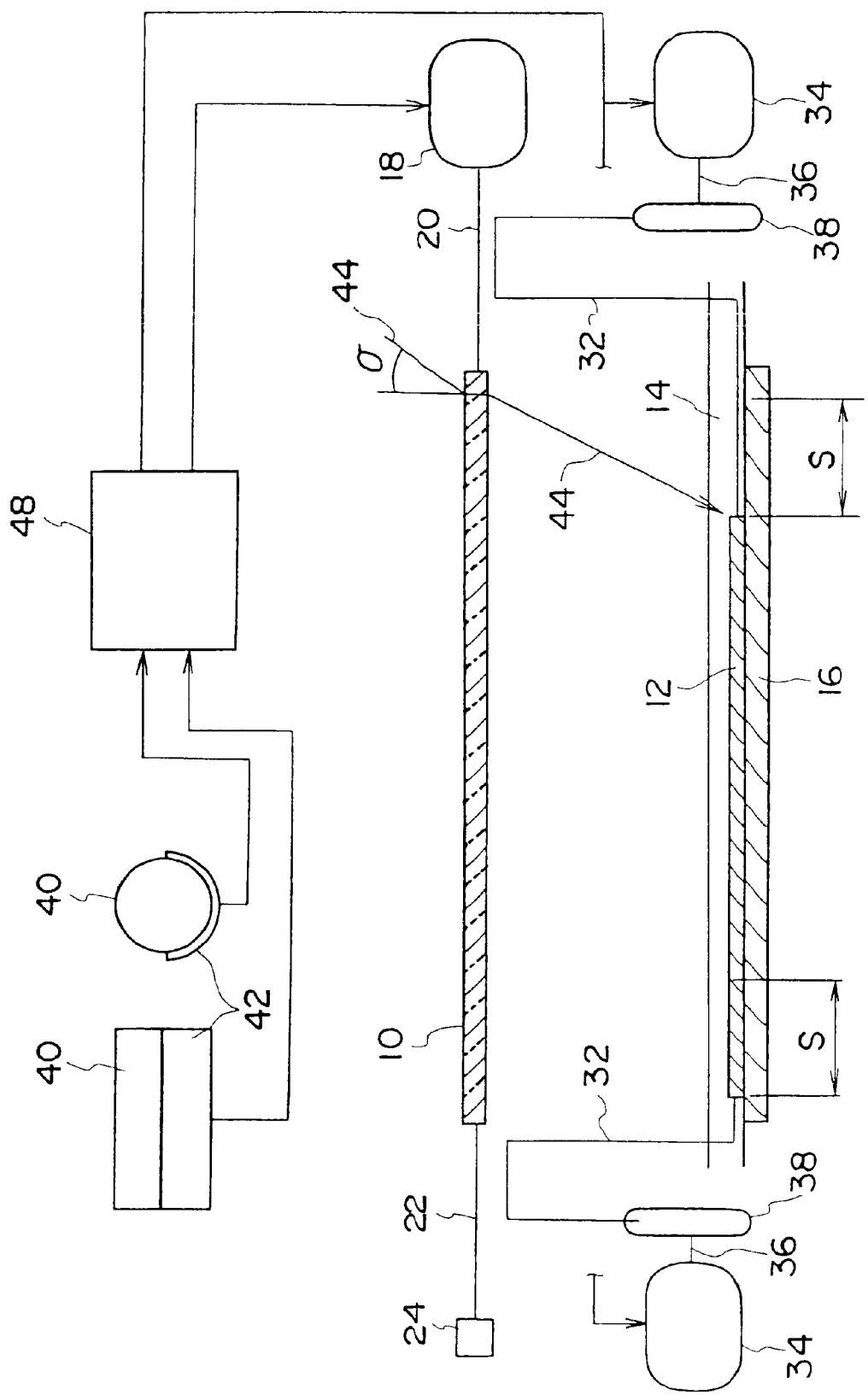
FIG. 1 is a diagram showing the structure of a converging solar module according to a first preferred embodiment of the present invention.

FIG. 1 is a diagram showing the structure of a converging solar module according to a first preferred embodiment of the present invention. An electricity generating converging lens 10 comprises a flat Fresnel lens made of resin. Therefore, the weight of such a converging lens 10 is significantly reduced, and rotating the lens 10 will require only a small amount of energy. Moreover, rotating the lens 10 around its center of gravity will require only a further reduced amount of energy. As a result, high efficiency can be maintained in electricity generation by the above converging solar module.

A solar cell 12 is located at and around a focal area of the electricity generating converging lens 10 and is cooled by a cooling pipe 14. Since the focal area of the converging lens 10 is of a linear shape, the solar cell 12 is also of a linear shape, and is placed on a similarly linearly shaped solar cell holder plate 16.

The electricity generating converging lens 10 is connected at one end to the shaft 20 of a rotation driving motor 18 and at the other end to a shaft 22, which is rotatably attached to a bearing 24. In this embodiment, when the shaft 20 is driven to be rotated by the rotation driving motor 18, the converging lens 10, the solar cell 12, and the solar cell holder plate 16 are rotated as one unit.

Figure 2A:
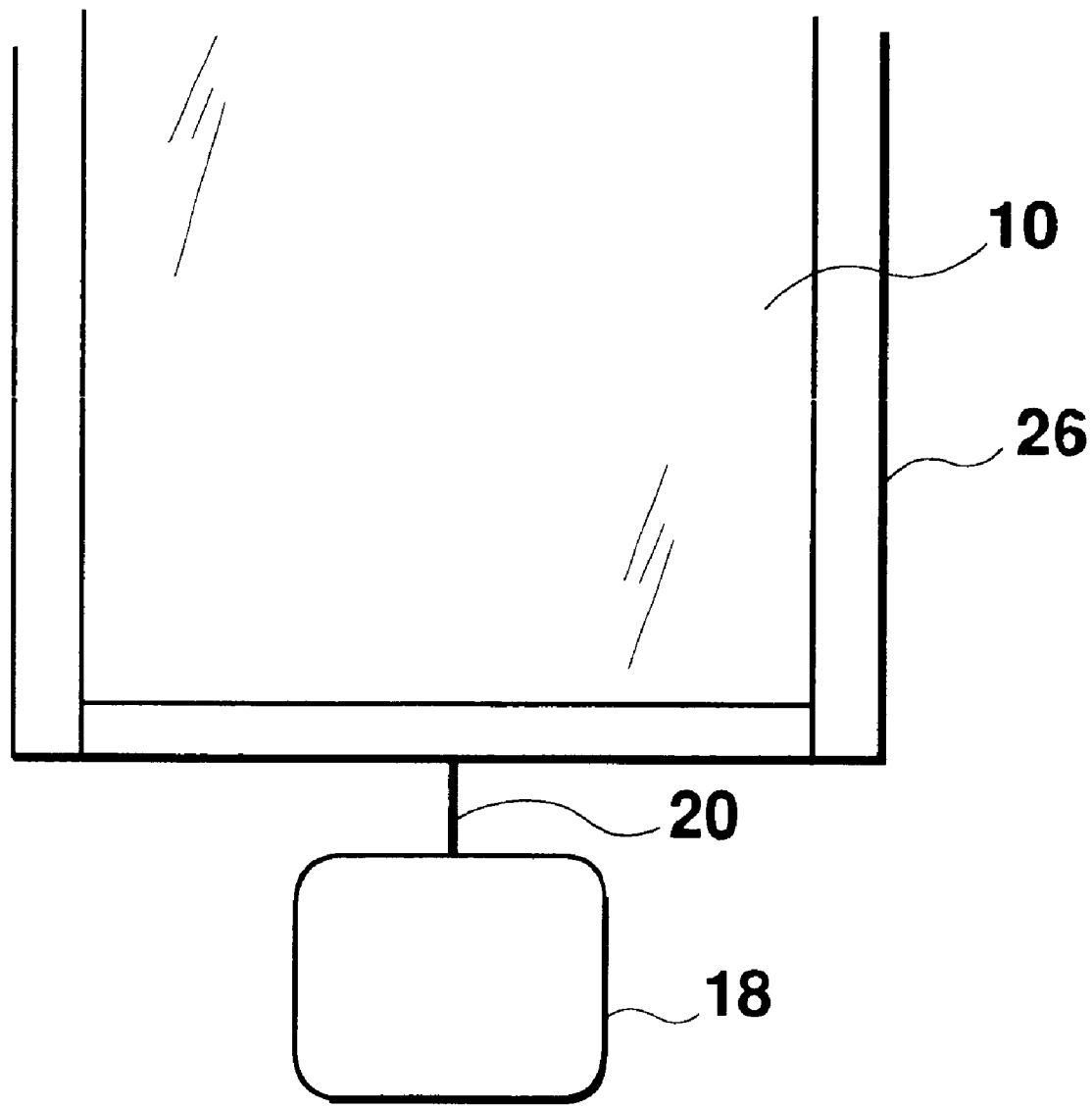
FIG. 2a is a plan view of the converging solar module shown in FIG. 1.
Figure 2B:
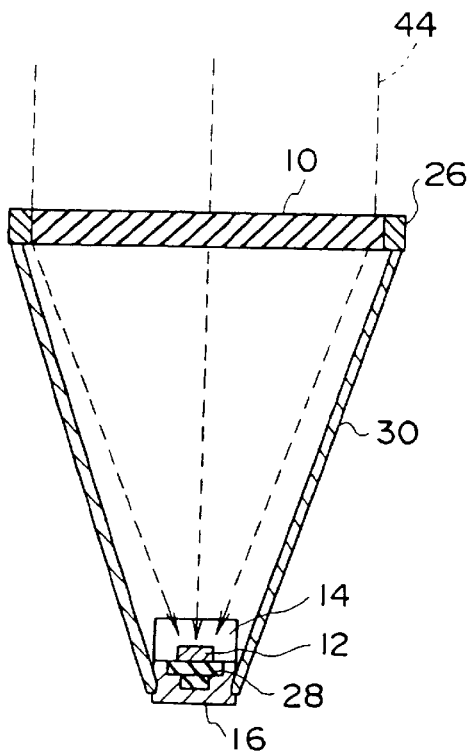
FIG. 2b is a diagram explaining rotation of the electricity generating converging lens and the solar module shown in FIG. 1.
Figure 2C:
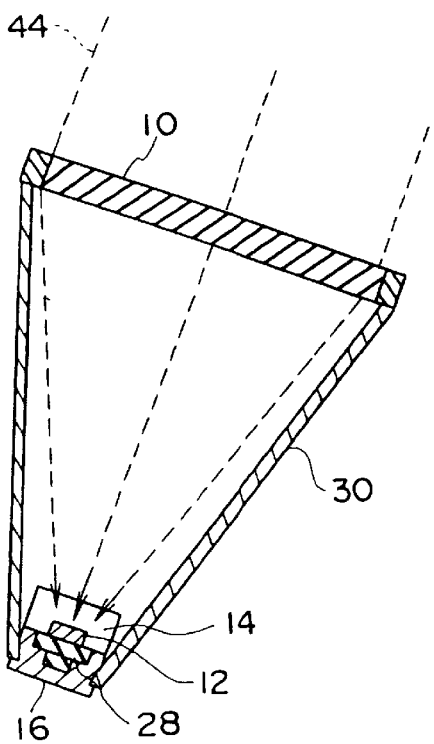
FIG. 2c is a diagram explaining rotation of the electricity generating converging lens and the solar module shown in FIG. 1.

FIG. 2 is a diagram showing the state of rotation of an electricity generation converging lens 10 and a solar cell 12; FIG. 2a is a plan view of the converging solar module shown in FIG. 1; and FIGS. 2b and 2c are cross sectional views thereof. In FIG. 2a, the electricity generation converging lens 10 is fixed to a lens fixing frame 26 to which the shaft 20 of the rotation driving motor 18 is fixedly attached. In FIGS. 2b and 2c, the solar cell 12 is placed above a movement rail 28 so as to be slidable inside the cooling pipe 14 in the vertical direction with respect to the sheet of the drawings. The solar cell holder plate 16 is fixedly connected via the cell fixing frame 30 to the lens fixing frame 26. Thus, when the shaft 20 is rotated by the rotation driving motor 18, the electricity generation converging lens 10, the solar cell 12, the solar cell holder plate 16, the movement rail 28, and the cell fixing frame 30 are rotated as one unit, as shown in FIGS. 2b and 2c.

Referring to FIG. 1, both ends of the solar cell 12 are hung by wires 32. The other ends of the wires 32 respectively wind around respective pulleys 38 which are attached to corresponding horizontally driving motors 34. When one of the pulleys 38 is driven by a corresponding motor 34 via a connected shaft 36, the connecting wire 32 is wound around the pulley 38. Accordingly, the solar cell 12 moves on the movement rail 28 horizontally in the direction of the winding wire. The solar cell 12 can move in both right and left horizontal directions in FIG. 1, as a horizontally driving motor 34 is provided to each end of the solar cell 12.

In this embodiment, a position detecting converging lens 40 having a cylindrical shape is provided which comprises a glass column or a transparent cylindrical pipe or the like, filled with a transparent liquid, such as water. A position detecting sensor 42 is provided in the vicinity of the focal area of the position detecting converging lens 40 on its circumferential surface.

Figure 3:
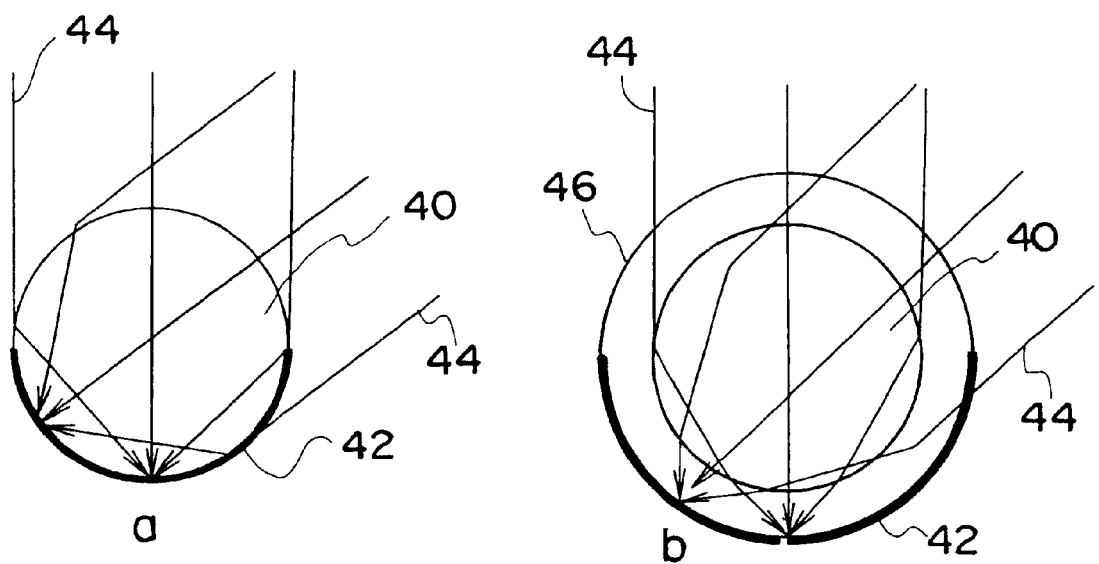
FIG. 3a is a diagram illustrating one positional relationship between the position detecting converging lens and the position detecting sensor shown in FIG. 1.
FIG. 3b is a diagram illustrating another positional relationship between the position detecting converging lens and the position detecting sensor shown in FIG. 1.

FIGS. 3a, 3b are diagrams showing example structures of a position detecting converging lens 40 and a position detecting sensor 42. In FIG. 3a, the converging lens 40 comprises a column whose reflection factor is approx. 1.5, wherein the focal area of the lens 40 falls on the circumferential surface thereof. A position detecting sensor 42 is thus attached on the circumferential surface of the lens 40. Sunlight 44 incident on the lens 40 is converged at the sensor 42 to determine the position of the sun.

In FIG. 3b, the converging lens 40 comprises a column whose reflection factor is approx. 1.3 to 1.4. Such a column may be realized by a glass cylinder filled with water. Since the reflection factor of water is 1.338, the focal area of such a lens is located outside the circumferential surface of the lens. Therefore, a transparent cylinder pipe 46 made of glass or the like is provided surrounding the converging lens 40 such that the focal area of the lens 40 falls on the inner surface thereof, and a position detecting sensor 42 is attached thereon. Also in this structure, sunlight 44 incident on the lens 40 is converged at the sensor 42 to determine the position of the sun.

Figure 4:
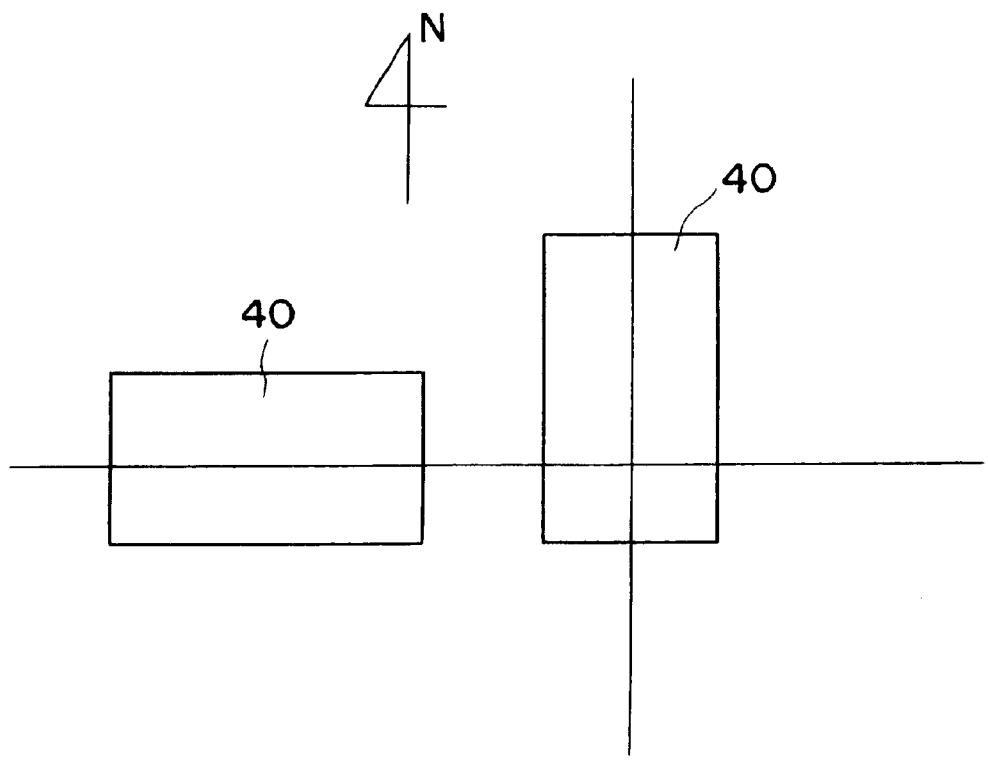
FIG. 4 is a diagram showing arrangement examples of the position detecting converging solar module shown in FIG. 1.

FIG. 4 is a plan view showing an arrangement example of the above position detecting converging lens 40 wherein a position detecting sensor 42 is omitted. Two position detecting converging lenses 40 are arranged vertically to each other; for instance, one is placed with its axis in the north-south direction (a converging lens in the north-south direction), while the other is placed in the east-west direction (a converging lens in the east-west direction). The converging lens 40 in the north-south direction detects daily movement of the sun, while the converging lens 40 in the east-west direction detects seasonal changes the sun's height. The detected position of the sun is expressed by an angle in which sunlight 44 is converged onto a position detecting sensor 42. The position detecting sensor 42 then outputs information concerning the angle as an angle signal.

Referring to FIG. 1, given the shaft 20 is placed in the north-south direction, which corresponds to the right-left direction on the sheet of FIG. 1. One of the position detecting converging lenses 40 is similarly placed, i.e., having its axis lying in the north-south direction, and the other in the east-west direction, which corresponds to the vertical direction with respect to the sheet of the drawing. With this arrangement, the position detecting sensor 42 attached to the converging lens 40 in the north-south direction supplies an angle signal to a controller 48, which then outputs a control signal based on the angle signal received to the rotation driving motor 18. In accordance with the angle signal, the motor 18 drives to rotate the electricity generating converging lens 10 and the solar cell 12.

As described above, the sun is located by a position detecting converging lens 40 which is placed in the same direction as the electricity generating converging lens 10, and expressed in the form of an angle signal. By rotating the electricity generating converging lens 10 by an angle corresponding to the angle signal, the sun can be accurately tracked. That is, the above arrangement constitutes a simply structured tracking mechanism for the sun.

Figure 5:
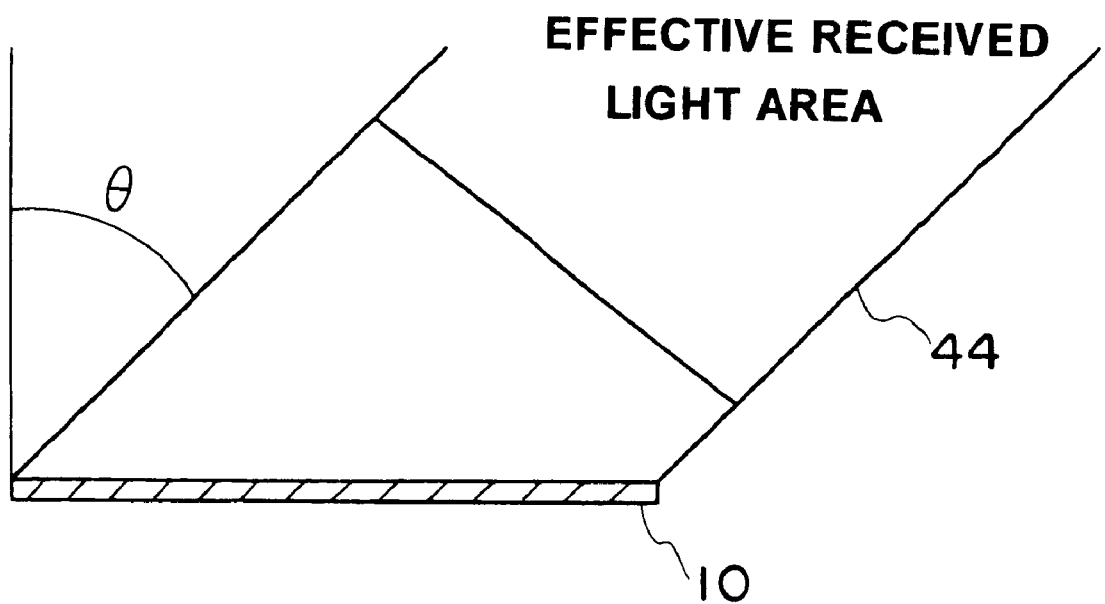
FIG. 5 is a diagram explaining an effective received light area.

In addition, when the electricity generating converging lens 10 is rotated using the above arrangement so as to be directed to incoming sunlight 44, as shown in FIGS. 2b and 2c, the light receiving surface of the lens 10 always faces in the vertical direction with respect to incoming sunlight 44. As the largest effective received light area is secured with sunlight incoming vertically to a converging lens 10, as shown in FIG. 5, the largest evective received light area can be secured with the lens 10 thus positioned. In other words, rotating the converged lens 10 as above allows effective introduction of sunlight 44 into the converging lens 10 and thereby achieves most efficient electricity generation using a solar cell 12.

In addition to detection of daily movement of the sun, the position detecting converging lens 40 in the east-west direction detects a seasonal change in height of the sun. Information in this regard is also supplied as an angle signal to the controller 48, which in turn outputs a control signal in accordance with the angle signal received to the horizontally driving motor 34. In response to the control signal received, the motor 34 drives a relevant pulley 38 to wind up a connecting wire 32, whereby the solar cell 12 is moved on the movement rail 28 in the north-south direction. With this arrangement, displacement of sunlight in north-south direction due to a seasonal change can be corrected, which further enhances efficiency in electricity generation.

The extent of displacement in the north-south direction S (a displaced extent S) of sunlight due to seasonal changes is expressed as S=f×sin σ, wherein σ is an angle formed by an incident angle of sunlight with respect to the vertical direction to the light receiving surface of a converging lens 40, and f is a focal distance of an electricity generating converging lens 10. The height of the sun varies throughout the year within a range from −23° to +23° with the maximum displacement of f×sin (23)=0.4f. The electricity generating converging lens 10 must be initially installed so as to face in the middle direction (±0° direction).

Seasonal changes in height of the sun also affect an effective received light area. To be specific, when sunlight incomes into a converging lens 40 with an angle inclined by σ from the vertical direction to the light receiving surface of the lens 40, the resulting effective received light area is cosσ times as large as that with sunlight incoming vertically. For example, with an inclination angle 23°, the effective received light area is reduced to 0.92 times as large as that with vertical sunlight. However, since this much reduction in the area is not a major problem, the direction of the converging lens 10 is not absolutely required to be adjusted in accordance with seasonal changes, and the aforementioned horizontal adjustment (in the north-south direction) may be sufficient.

It should be noted that arrangement of an electricity generating converging lens 10 and position detecting converging lenses 40 need not be limited to the above in which the former and one of the latter lie in the north-south direction and the other of the latter lies in the east-west direction. Although an electricity generating converging lens 10 generates the greatest amount of electricity when it lies in the north-south direction, a converging lens 10 which cannot be arranged in the north-south direction due to installation restrictions and so on and is therefore arranged displaced from the appropriate direction can still accurately detect and track the position of the sun using the method of this embodiment when a position detecting converging lens 40 is placed in parallel to the converging lens 10 displaced. This is because sunlight having passed through the converging lens 10 is converged at the linear focal area of the converging lens 10 regardless of the direction in which the lens 10 is placed as sunlight can be considered as parallel light, and tracking of the sun can be therefore performed accurately according to the procedure described above. With a converging lens 10 arranged displaced as above, such displacement in the north-south direction does not need to be considered in this method as focal area is directly detected in this method, though such displacement must be measured correctly and reflected in the programming when a program method is employed.

Embodiment 2.

Figure 6:
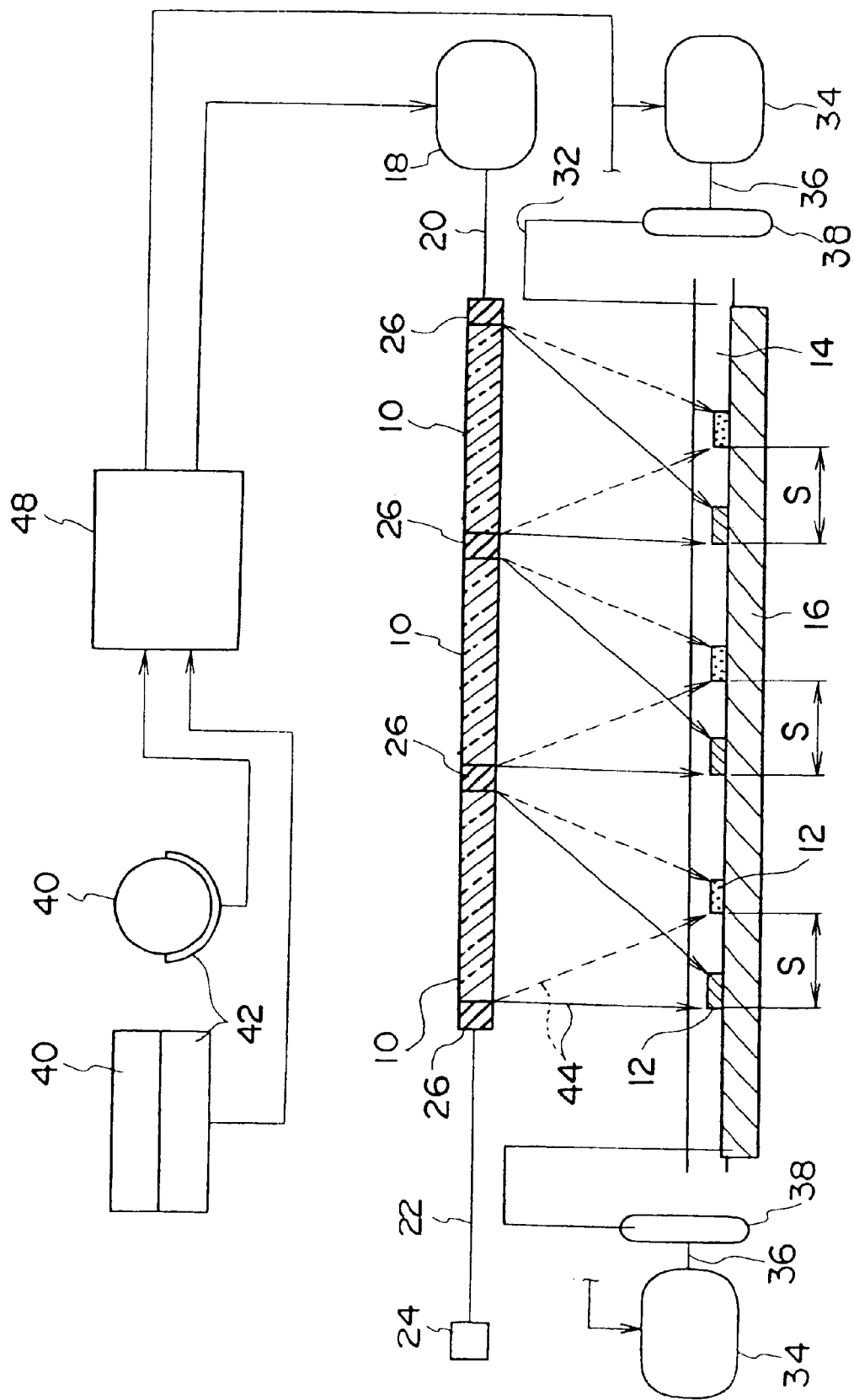
FIG. 6 is a diagram showing the structure of a converging solar module according to a second preferred embodiment of the present invention.
Figure 7A:
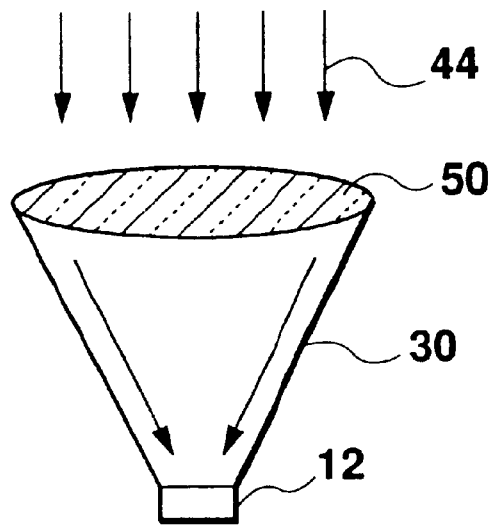
FIG. 7a is a diagram explaining tracking of sunlight by a conventional converging solar module.
Figure 7B:
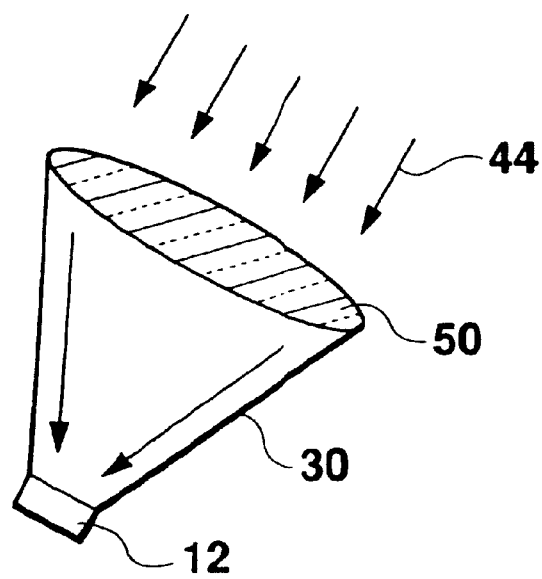
FIG. 7b is a diagram explaining tracking of sunlight by a conventional converging solar module.

FIG. 6 is a diagram showing the structure of a second preferred embodiment of the solar module of this invention, in which the same elements as those in the first embodiment are given the same reference numerals and their explanations are omitted.

This embodiment is characterized by the fact that an electricity generating converging lens 10 comprises a plurality of Fresnel lenses having functions of a spherical lens, arranged in a plurality of arrays in the direction of the shaft 20 of the rotation driving motor 18, which is a rotation axis of driving means. In the drawing, three electricity generating converging lenses 10 are arranged and connected to each other via the lens fixing frame 26. Since the lens 10 has functions of a spherical lens, sunlight can be converged at a higher converging factor. With a higher converging factor, a solar cell 12 shorter than that used in the first embodiment is sufficient in this embodiment. Therefore, a short solar cell 12 is provided for every converging lens 10, which are arranged discrete from each other. With such an arrangement, the use area of expensive solar battery cells can be further reduced.

Similar to FIG. 1, these solar battery cells 12 are placed above the movement rail (not shown) on the solar battery holding plate 16, and moved on the rail in the right-left direction of the drawing sheet by being pulled by a wire 32 wound around a pulley 38 when it is driven by a relevant horizontally driving motor 34. The displaced extent S is determined similar to the displaced extent S in FIG. 1, that is, S=f×sinσ, wherein σ is an angle displaced from the vertical direction with respect to the converging lens 10. In FIG. 6, broken lines relate to sunlight 44 vertically incoming into the converging lens 10, while solid lines indicate sunlight incoming with some inclination. In each case, the solar battery cells 12 are moved accordingly by the horizontally moving motor 34.

The electricity generating converging lenses 10 and the solar battery cells 12 are moved while being rotated as a whole by the shaft 20, which is rotated by the rotation driving motor 18.

The rotation driving motor 18 and the horizontally driving motor 34 are controlled by the controller 48 so as to adjust positions of the converging lens 10 and the solar battery cells 12, similar to FIG. 1, based on the position of the sun which has been detected by a cylindrical position detection converging lens 40 and a position detection sensor 42 which is situated in the vicinity of the focal area of the converging lens 40 on its circumferential surface.

As described above, according to the present invention, the sun is located by a cylindrical position detecting converging lens and a position detecting sensor which is situated in the vicinity of the focal area of the converging lens on its circumferential surface. This arrangement achieves a simply-structured device capable of detecting the position of the sun. Further, the maximum effective received light area can always be secured by rotating an electricity generating converging lens and a solar battery cell as a whole so that the converging lens is directed vertical to incoming sunlight all the time. This enables maintaining high efficiency in electricity generation using solar battery cells.

As a result of the above, accurate tracking of the sun can be achieved with a simple structure, which eventually makes it possible to provide a converging solar module which performs highly efficient electricity generation.

While there have been described what are at present considered to be preferred embodiments of the invention, it will be understood that various modifications may be made thereto, and it is intended that the appended claims cover all such modifications as fall within the true spirit and scope of the invention.

What is claimed is:

1. A converging solar module for generating electricity while tracking and converging sunlight, comprising:

a position detecting converging lens having a cylindrical shape;

a position detecting sensor arranged in the vicinity of the focal area of the position detecting converging lens on a circumferential surface thereof;

an electricity generating converging lens made of resin and having a flat shape;

a solar cell arranged in the vicinity of the focal area of the electricity generating converging lens; and a driver driving to rotate the electricity generating converging lens and the solar cell as one unit in response to a signal from the position detecting sensor thereby directing the electricity generating converging lens and the solar cell to the sun.

2. The solar module as defined in claim 1, wherein the electricity generating converging lens is a Fresnel lens having a linear focal area.

3. The solar module as defined in claim 2, wherein the solar cell is constructed to have a linear shape so as to match the linear focal area of the electricity generating converging lens, and is capable of moving horizontally along the linear focal area.

4. The solar module as defined in claim 1, wherein the electricity generating converging lens and the solar cell are respectively divided into a plurality of units, which are provided in a rotation axial direction of the driver.

5. The solar module as defined in claim 4, wherein the electricity generating converging lens functions as a spherical lens.

* * * * *